United States Patent
Lee et al.

(10) Patent No.: US 11,515,283 B2
(45) Date of Patent: Nov. 29, 2022

(54) FLEXIBLE CIRCUIT FILM BONDING APPARATUS AND METHOD OF BONDING FLEXIBLE CIRCUIT FILM USING THE SAME

(71) Applicant: Samsung Display Co., LTD., Yongin-si (KR)

(72) Inventors: Chung-Seok Lee, Hwaseong-si (KR); Joongmok Lee, Gunsan-si (KR); Eunjeong Jeon, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 342 days.

(21) Appl. No.: 16/799,811

(22) Filed: Feb. 24, 2020

(65) Prior Publication Data

US 2020/0373276 A1 Nov. 26, 2020

(30) Foreign Application Priority Data

May 22, 2019 (KR) .................. 10-2019-0059801

(51) Int. Cl.
*H01L 27/12* (2006.01)
*H01L 23/00* (2006.01)

(52) U.S. Cl.
CPC .............. *H01L 24/75* (2013.01); *H01L 24/83* (2013.01); *H01L 27/124* (2013.01);
(Continued)

(58) Field of Classification Search
CPC ....... H01L 24/75; H01L 24/83; H01L 27/124; H01L 2224/75301; H01L 2224/75502; H01L 2224/75804; H01L 2224/75824; H01L 2224/83203; H01L 2224/83851; H01L 24/29; H01L 24/32; H01L 2224/2929; H01L 2224/293; H01L 2224/32227; H01L 2224/75251;
(Continued)

(56) References Cited

U.S. PATENT DOCUMENTS 6,077,382 A * 6/2000 Watanabe .................. C09J 5/06
156/322
7,784,670 B2 * 8/2010 Suga .................... B23K 20/023
438/455

(Continued)

FOREIGN PATENT DOCUMENTS

JP 1995-130795 5/1995
JP 2001-230273 8/2001
(Continued)

*Primary Examiner* — Vu A Vu
(74) *Attorney, Agent, or Firm* — H.C. Park & Associates, PLC

(57) ABSTRACT

A flexible circuit film bonding apparatus includes: a stage configured to support a TFT substrate; a pressing head configured to press and heat a flexible circuit film attached on the TFT substrate with an anisotropic conductive film interposed therebetween; a backup plate configured to support and heat the TFT substrate positioned below the flexible circuit film; and a heating control unit configured to control a temperature of a lower surface of the pressing head and an upper surface of the backup plate, wherein the temperature of the upper surface of the backup plate is less than 170 degrees Celsius.

19 Claims, 6 Drawing Sheets

(52) U.S. Cl.
CPC ......... *H01L 2224/75301* (2013.01); *H01L 2224/75502* (2013.01); *H01L 2224/75804* (2013.01); *H01L 2224/75824* (2013.01); *H01L 2224/83203* (2013.01); *H01L 2224/83851* (2013.01)

(58) Field of Classification Search
CPC ....... H01L 2224/75901; H01L 27/1259; H01L 2224/75252; H01L 2224/83121; H01L 2224/83862; H01L 2224/83908; H01L 21/67092; H01L 21/67098; H01L 21/67144; H05K 2203/081; H05K 3/361; H05K 2201/10128; H05K 3/323; G02F 1/1345; G02F 1/1303
USPC .............................................. 160/60; 156/60
See application file for complete search history.

(56) References Cited

U.S. PATENT DOCUMENTS

| | | | | |
|---|---|---|---|---|
| 7,861,913 B2 * | 1/2011 | Miyazaki | ................ | H01L 24/75 228/103 |
| 8,486,212 B2 * | 7/2013 | Hamazaki | ............... | H01L 24/75 438/118 |
| 2018/0366434 A1 | 12/2018 | McClain et al. | | |
| 2019/0057215 A1 | 2/2019 | Robinson | | |
| 2019/0057946 A1 | 2/2019 | Chuang et al. | | |
| 2020/0010740 A1 * | 1/2020 | Lee | ............................ | C09J 9/02 |

FOREIGN PATENT DOCUMENTS

| KR | 10-0645003 | 11/2006 |
|---|---|---|
| KR | 10-2009-0062062 | 6/2009 |

* cited by examiner

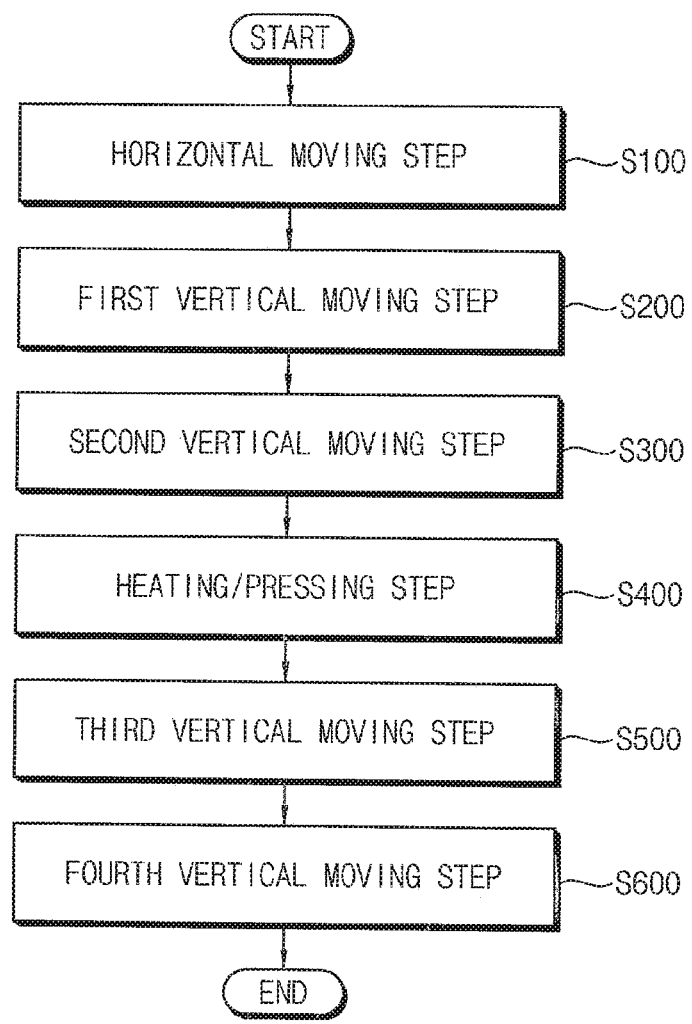

FLEXIBLE CIRCUIT FILM BONDING APPARATUS AND METHOD OF BONDING FLEXIBLE CIRCUIT FILM USING THE SAME

This application claims priority from and the benefit of Korean Patent Application No. 10-2019-0059801, filed on May 22, 2019, which is hereby incorporated by reference for all purposes as if fully set forth herein.

BACKGROUND

Field

Exemplary embodiments of the invention relate generally to a flexible circuit film bonding apparatus and a method of bonding a flexible circuit film using the flexible circuit film bonding apparatus. More particularly, exemplary embodiments of the invention relate generally to a flexible circuit film bonding apparatus for manufacturing a display apparatus and a method of bonding a flexible circuit film using the flexible circuit film bonding apparatus.

Discussion of the Background

Recently, a display apparatus having lightweight and small size has been manufactured. A cathode ray tube (CRT) display apparatus has been used due to it's performance and competitive price. However, the large size and decreased portability of the CRT display apparatus cause issues. Therefore a display apparatus such as a plasma display apparatus, a liquid crystal display apparatus, and an organic light emitting display apparatus has been highly regarded due to being small in size, lightweight, and having low-power-consumption.

A flexible circuit film bonding apparatus is a device for attaching a flexible film on a substrate using an anisotropic conductive film and providing heat and pressure to connect a conductive pattern on the substrate to a conductive pattern connected to a chip on the flexible film.

When the flexible circuit film is bonded to the substrate using the flexible circuit film bonding apparatus, the process may be delayed, and an excessive heat transfer may occur to cause a failure.

The above information disclosed in this Background section is only for understanding of the background of the inventive concepts, and, therefore, it may contain information that does not constitute prior art.

SUMMARY

Devices constructed according to exemplary embodiments of the invention are capable of providing a flexible circuit film bonding apparatus capable of preventing or reducing defects. Methods according to exemplary embodiments of the invention also provide a method of bonding a flexible circuit film using the flexible circuit film bonding apparatus.

Additional features of the inventive concepts will be set forth in the description which follows, and in part will be apparent from the description, or may be learned by practice of the inventive concepts.

According to one or more exemplary embodiments of the invention, a flexible circuit film bonding apparatus includes: a stage configured to support a TFT substrate; a pressing head configured to press and heat a flexible circuit film attached on the TFT substrate with an anisotropic conductive film interposed therebetween; a backup plate configured to support and heat the TFT substrate positioned below the flexible circuit film; and a heating control unit configured to control a temperature of a lower surface of the pressing head and an upper surface of the backup plate, wherein the temperature of the upper surface of the backup plate is less than 170 degrees Celsius.

The temperature of the lower surface of the pressing head may be controlled to be higher than the temperature of the upper surface of the backup plate.

The temperature of the upper surface of the backup plate may be controlled to be equal to or greater than 150 degrees Celsius and less than 170 degrees Celsius.

The temperature of the lower surface of the pressing head may be controlled to be equal to or greater than 150 degrees Celsius and less than 200 degrees Celsius.

The flexible circuit film bonding apparatus may further include: a head driving unit configured to move the pressing head in a vertical direction; and a stage driving unit configured to move the stage along the vertical direction and a horizontal direction perpendicular to the vertical direction, and the backup plate may be disposed at a fixed location spaced apart from the stage.

One side of the lower surface of the pressing head and one side of the upper surface of the backup plate may be arranged to align in the vertical direction.

The pressing head may be configured to press the flexible circuit film while being spaced apart from an optical member disposed on the TFT substrate, wherein the flexible circuit film bonding apparatus may further include an air supply unit configured to supply air between the optical member and the pressing head to block heat generated by the pressing head from being transmitted to the optical member.

The head driving unit may be configured to move the pressing head at one of a first speed and a second speed, the second speed being slower than the first speed, and the stage driving unit may be configured to move the stage at a third speed in the vertical direction, the third speed being slower than the second speed.

According to one or more exemplary embodiments of the invention, a method of bonding a flexible circuit film, the method includes: horizontally moving a stage, a TFT substrate being disposed on a stage in a horizontal direction to position a flexible circuit film between a pressing head and a backup plate, the flexible circuit film being attached to the TFT substrate with an anisotropic conductive film interposed therebetween; engaging the pressing head and the backup plate, including: vertically moving the pressing head and one of the backup plate and the stage in a vertical direction such that a lower surface of the pressing head contacts the flexible circuit film and an upper surface of the backup plate contacts the TFT substrate; heating and pressing the anisotropic conductive film interposed between the flexible circuit film and the TFT substrate by using the pressing head contacting the flexible circuit film and the backup plate contacting the TFT substrate, wherein a temperature of the upper surface of the backup plate is controlled to be less than 170 degrees Celsius; and disengaging the pressing head and the backup plate, including: vertically moving the pressing head and one of the backup plate and the stage in the vertical direction such that the head and the backup plate are detached from the flexible circuit film and the TFT substrate.

The heating and pressing of the anisotropic conductive film may include: controlling a temperature of the lower surface of the pressing head to be higher than the temperature of the upper surface of the backup plate.

The heating and pressing of the anisotropic conductive film may further include: controlling the temperature of the upper surface of the backup plate to be equal to or greater than 150 degrees Celsius and less than 170 degrees Celsius.

The heating and pressing of the anisotropic conductive film may further include; controlling the temperature of the lower surface of the pressing head may be controlled to be equal to or greater than 150 degrees Celsius and less than 200 degrees Celsius.

The engaging of the pressing head and the backup plate may further include: vertically moving the pressing head at a first speed; and subsequent to vertically moving of the pressing head at the first speed, vertically moving the pressing head at a second speed slower than the first speed, and the stage at a third speed slower than the second speed, simultaneously.

The first speed may be about 5 to 20 times faster than the second speed.

The disengaging of pressing head and the backup plate may further include: vertically moving the pressing head at a fourth speed, and moving the stage vertically at a fifth speed slower than the fourth speed; and subsequent to vertically moving of the pressing head at the fourth speed, vertically moving the pressing head vertically at a sixth speed faster than the fourth speed.

The horizontally moving of the stage may include: disposing the stage such that a distance between the lower surface of the pressing head and the flexible circuit film may be equal to or greater than 1.5 times a distance between the upper surface of the backup plate and the TFT substrate, and wherein vertically moving of the pressing head at the first speed may include: vertically moving the pressing head at the first speed such that the distance between the lower surface of the pressing head and the flexible circuit film may be greater than the distance between the upper surface of the backup plate and the TFT substrate.

The disengaging the pressing head and the backup plate may further include: vertically moving the pressing head and one of the backup plate and the stage in the vertical direction such that the lower surface of the pressing head contacts on the flexible circuit film after the upper surface of the backup plate contacts the TFT substrate.

The engaging of the pressing head and the backup plate may further include: vertically moving the pressing head and one of the backup plate and the stage in a vertical direction such that the pressing head presses the flexible circuit film while being spaced apart from an optical member disposed on the TFT substrate, and wherein the heating and pressing of the anisotropic conductive film may include: providing air between the optical member and the pressing head to block heat generated by the pressing head from being transmitted to the optical member.

One side of the lower surface of the pressing head and one side of the upper surface of the backup plate may be arranged to align in the vertical direction, and wherein the backup plate may be disposed at a fixed location spaced apart from the stage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 4 is a flow chart showing a method of bonding a flexible circuit film using a flexible circuit film bonding apparatus according to an exemplary embodiment.

DETAILED DESCRIPTION

Figure 1:
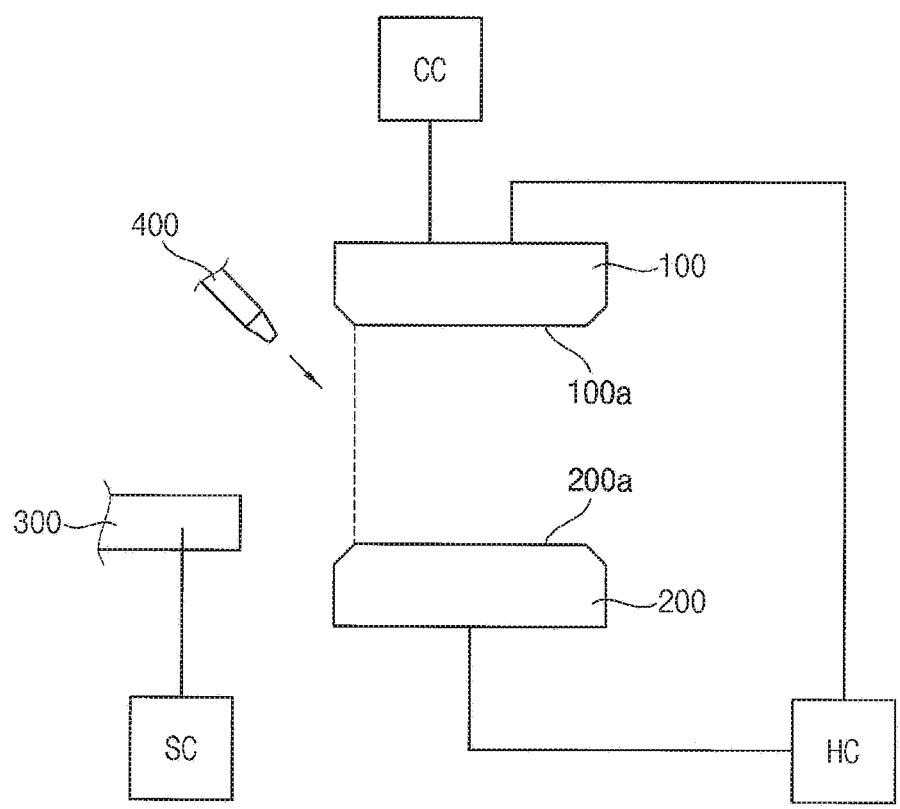
FIG. 1 is a side view schematically illustrating a flexible circuit film bonding apparatus according to an exemplary embodiment.
Figure 1:
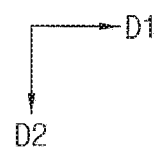

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis and the D2-axis are not limited to axes of a rectangular coordinate system, such as the x, y, and z-axes, and may be interpreted in a broader sense. For example, the D1-axis and the D2-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, the inventive concept will be explained in detail with reference to the accompanying drawings.

Figure 2A:
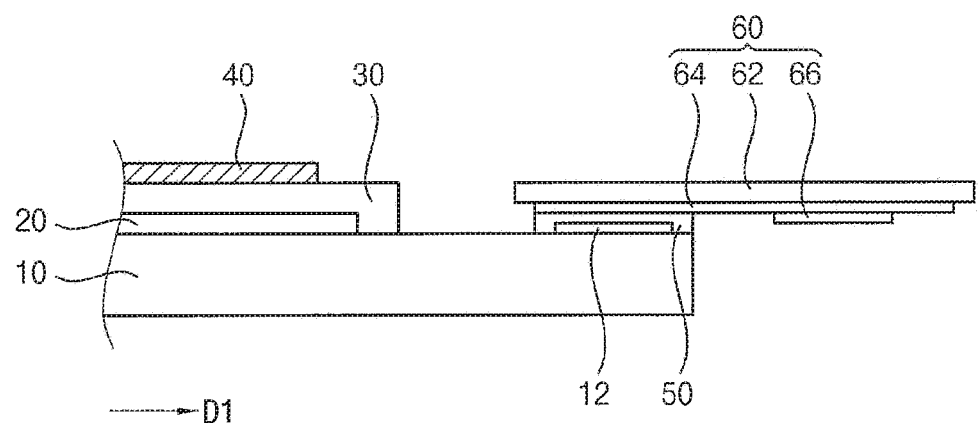
FIG. 2A illustrates a display apparatus including a flexible circuit film attached to a substrate of the display apparatus using the flexible circuit film bonding apparatus of FIG. 1.
Figure 2B:
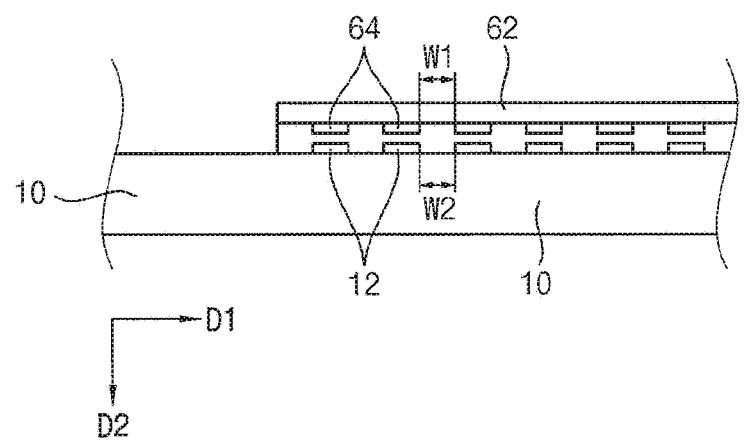
FIG. 2B is a cross-sectional view of the display apparatus taken along a width direction of connecting lines of the flexible circuit film of FIG. 2A.

FIG. 1 is a side view schematically illustrating a flexible circuit film bonding apparatus according to an exemplary embodiment. FIG. 2A illustrates a display apparatus including a flexible circuit film is to a substrate of the display apparatus using the flexible circuit film bonding apparatus of FIG. 1. FIG. 2B is a cross-sectional view of the display apparatus taken along a width direction of connecting lines of the flexible circuit film of FIG. 2A.

Referring to FIG. 1, the flexible circuit film bonding apparatus may include a pressing head 100, a backup plate 200, a stage 300, an air supply unit 400, a head driving unit CC, a heating control unit HC and a stage driving unit SC.

The pressing head 100 may be configured to press and heat an anisotropic conductive film between a TFT substrate and a flexible circuit film to electrically connect the TFT substrate to the flexible circuit film. The pressing head 100 may be formed using alloys with relatively low coefficient of thermal expansion. For example, the pressing head 100 may be formed using hard metal made by firing metal carbide powder, stainless steel, or the like.

The pressing head 100 may be provided to move along a second direction D2 which is a direction perpendicular to a ground by the head driving unit CC. That is, the head driving unit CC may move the pressing head 100 along the second direction D2 which is a direction perpendicular to the ground. For example, the head driving unit CC may be a cylinder connected to the pressing head 100 and a configuration for controlling the cylinder.

The head driving unit CC may move the pressing head 100 at a first speed or a second speed slower than the first speed. The first speed may be about 5 to 20 times faster than the second speed. For example, the first speed may be 100 mm/s, and the second speed may be 10 mm/s.

The backup plate 200 may be configured to support the TFT substrate and heat the anisotropic conductive film, and may be formed using an alloy having a relatively low coefficient of thermal expansion. For example, the backup plate 200 may be formed using hard metal which is made by firing metal carbide powder, stainless steel, or the like.

The backup plate 200 may be disposed at a fixed location. Here, one side of a lower surface 100*a* of the pressing head 100 and one side of an upper surface 200*a* of the backup plate 200 may be disposed to coincide in a vertical direction, that is, the second direction D2 (see dotted line in FIG. 3A).

The heating control unit may control a temperature of the lower surface 100*a* of the pressing head 100 and the upper surface 200*a* of the backup plate 200. In detail, the heating control unit HC may control the temperature of the upper surface 200*a* of the backup plate 200 to be heated to a temperature of less than 170 degrees(° C.). The temperature of the lower surface 100*a* of the pressing head 100 may be controlled to be higher than the temperature of the upper surface 200*a* of the backup plate 200. The temperature of the upper surface 200*a* of the backup plate 200 may be controlled to 150 or more and less than 170 degrees. The temperature of the lower surface 100*a* of the pressing head 100 may be controlled to a temperature of 150 to 200 degrees.

When the temperature of the pressing head 100 and the backup plate 200 is higher than an appropriate level, the anisotropic conductive film (refers to 50 of FIG. 2A) may be cured in a short time. When excessive heat is transmitted to the TFT substrate or an element on the TFT substrate (refers to 40 of FIG. 2A) which is for example, an optical member such as a polarizing plate that is vulnerable to heat, can be damaged.

Heating of the pressing head 100 or the backup plate 200 may be performed by a constant heat method or a pulse heat method. The constant heat method is a method of changing the temperature of the anisotropic conductive film by applying pressure to the flexible circuit film for a predetermined time while the temperature of the pressing head 100 or the backup plate 200 is kept constant. The pulse heating method is a method of generating heat using pulses and has a high degree of freedom in temperature control, so that it easy to select an optimal temperature.

The stage 300 may support the TFT substrate. The stage driving unit SC may move the stage 300 along the second direction D2 and a first direction D1 which is a horizontal direction perpendicular to the second direction D2. The stage driver SC may move the stage 300 at a third speed slower than the second speed along the second direction D2. For example, the third speed may be 4.5 mm/s.

The air supply unit 400 may supply air between the optical member on the TFT substrate and the pressing head 100 to block heat from the pressing head 100 from being transmitted to the optical member.

According to this embodiment, the location of the backup plate 200 is fixed, while the stage 300 and the pressing head 100 is provided to be moved, but is not limited thereto. For example, the backup plate 200 may be provided to move.

Referring to FIGS. 2 and 3, the display apparatus may includes a TFT substrate 10, a light emitting member 20, a sealing member 30, an optical member 40, an anisotropic conductive film 50, and a flexible circuit film 60.

The TFT substrate 10 may be a substrate including a thin film transistor. For example, the TFT substrate 10 may include a base substrate, a plurality of insulating layers formed on the base substrate, and a thin film transistor and a circuit wiring formed between the insulating layers. For example, the TFT substrate 10 may be an LTPS substrate including a low temperature polysilicon thin film transistor.

The light emitting member 20 may be disposed on the TFT substrate 10. The sealing member 30 may be formed on the TFT substrate 10 on which the light emitting member 20 is disposed to seal the light emitting member 20. The optical member 40 may be disposed on the sealing member 30. For example, the optical member 40 may be a polarizer.

A contacting electrode 12 may be formed on one side of the TFT substrate 10. The contacting electrode 12 may have a width along a third direction D3 perpendicular to the first direction D1 on a plane, and a plurality of contacting electrodes 12 may be arranged in the third direction D3 with a second interval w2.

The anisotropic conductive film 50 (ACF) may be disposed on the contacting electrode 12. The anisotropic conductive film 50 may be, for example, an adhesive film in which conductive particles of several um(micrometers) are dispersed in an epoxy and an acrylic resin. When the anisotropic conductive film 50 is pressed and heated by a flexible circuit film bonding apparatus, the anisotropic conductive film 50 is thermocompressed and cured, and the conductive particles in the anisotropic conductive film 50 may electrically connect the contacting electrode 12 to a connecting electrode 64 of the flexible circuit film 60.

The flexible circuit film 60 may be attached onto the anisotropic conductive film 50. The flexible circuit film 60 may include a base film 62, a connecting electrode 64 disposed on the base film 62, and a protective layer 66 covering a portion of the connecting electrode 64. An exposed portion of the connecting electrode 64 may be disposed to correspond to the contacting electrode 12, and the plurality of connecting electrodes 64 may be arranged at a first interval w1 in the third direction D3.

At this time, in the process of thermocompression bonding the anisotropic conductive film 50, if excessive heat is transferred to the base film 62 of the flexible circuit film 60, the base film 62 may be thermal-expanded. As a result, the first interval w1 becomes larger than the second interval w2, and thus, the alignment between the plurality of connecting electrodes 64 and the plurality of contacting electrodes 12 may be misaligned and a defect may occur.

According to the embodiments, in the process of thermocompression bonding the anisotropic conductive film 50 between the flexible circuit film 60 and the TFT substrate 10, it is possible to control appropriate temperature, so that defects due to thermal-expansion can be prevented or reduced.

In particular, it is possible to prevent or reduce the occurrence of defects by attaching the flexible circuit film in a proper position, even when the interval between the contacting electrodes (the first interval w1) is narrower because of higher resolution of the display apparatus, reduction of peripheral area which is a non-display area in which contacting electrodes are disposed, or adoption of NoMux structure (NoMux structure referring to a structure free of multiplexer) due to lack of SOT (Scan On Time) according to an increase of the aspect ratio.

FIGS. 3A, 3B, 3C, 3D, 3E, and 3F are cross-sectional views illustrating a method of manufacturing a display apparatus using a flexible circuit film bonding apparatus according to an exemplary embodiment.

Figure 3A:
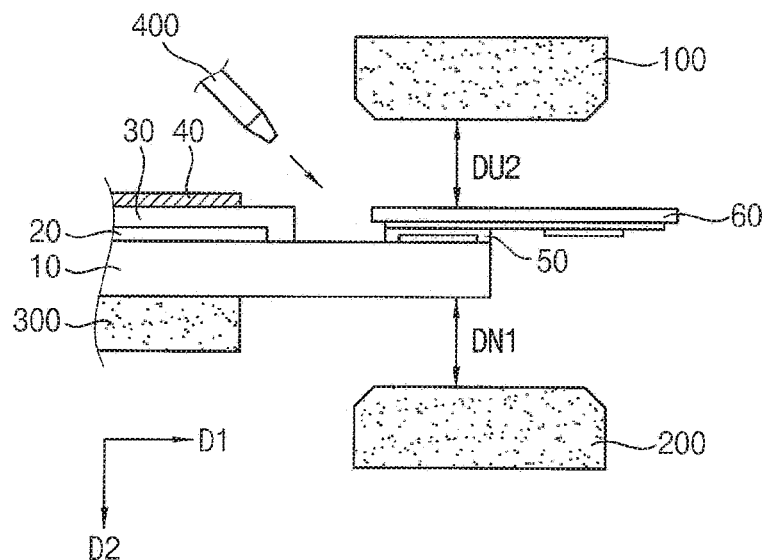
FIGS. 3A, 3B, 3C, 3D, 3E, and 3F are cross-sectional views illustrating a method of manufacturing a display apparatus using a flexible circuit film bonding apparatus according to an exemplary embodiment.

Referring to FIG. 3A, in a state where a flexible circuit film 60 is attached (preliminary attached) to a contacting electrode 12 of the TFT substrate 10 by an anisotropic conductive film 50, a TFT substrate 10 disposed on a stage 300 may be moved in a first direction D1, which is a horizontal direction, so that the flexible circuit film 60 may be positioned between a pressing head 100 and a backup plate 200.

At this time, between the flexible circuit film 60 and the lower surface of the pressing head 100 may be spaced apart by a first upper distance DU1, and between the TFT substrate 10 and the upper surface of the backup plate 200 may be spaced apart by a first lower distance DN1. The first upper distance DU1 may be at least 1.5 times greater than the first lower distance DN1. For example, the first upper distance DU1 may be 16 mm (millimeter) and the first lower distance DN1 may be 8 mm.

On the other hand, by supplying air between the optical member 40 and the pressing head 100 on the TFT substrate 10 by using the air supply unit 400, the optical member 40 may be protected from being damaged due to transmission of the heat from the pressing head 100 to the optical member 40.

Figure 3B:
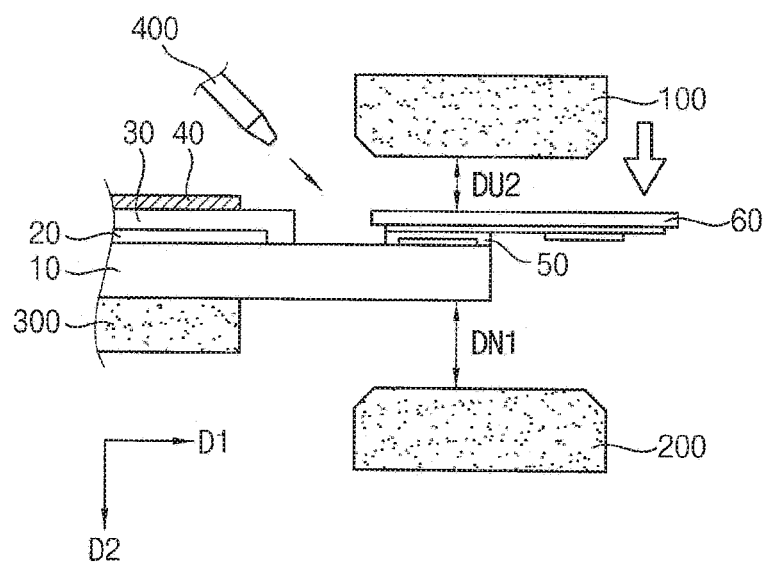

Referring to FIG. 3B, the pressing head 100 may be moved in a second direction D2 at a first speed. For example, the first speed may be 100 mm/s. Accordingly, the lower surface of the pressing head 100 and the flexible circuit film 60 may be spaced apart by a second upper distance DU2. For example, the second upper distance DU2 may be 10 mm.

Figure 3C:
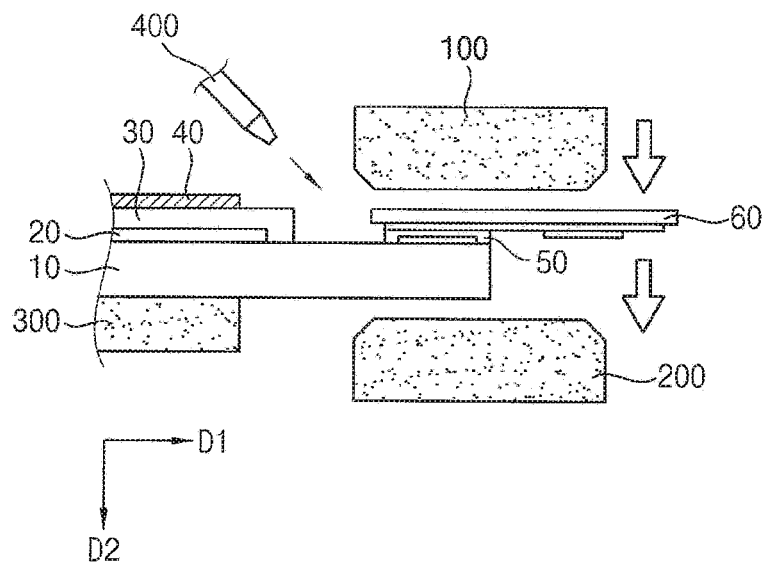

Referring to FIG. 3C, the pressing head 100 may be moved in the second direction D2 at a second speed slower than the first speed, and at the same time, the stage 300 may be moved in the second direction at a third speed slower than the second speed. For example, the second speed may be 10 mm/s, and the third speed may be 4.5 mm/s.

Accordingly, the upper surface of the backup plate 200 may first contacts the TFT substrate 10, and within a short time, the lower surface of the pressing head 100 may contact the flexible circuit film 60.

Figure 3D:
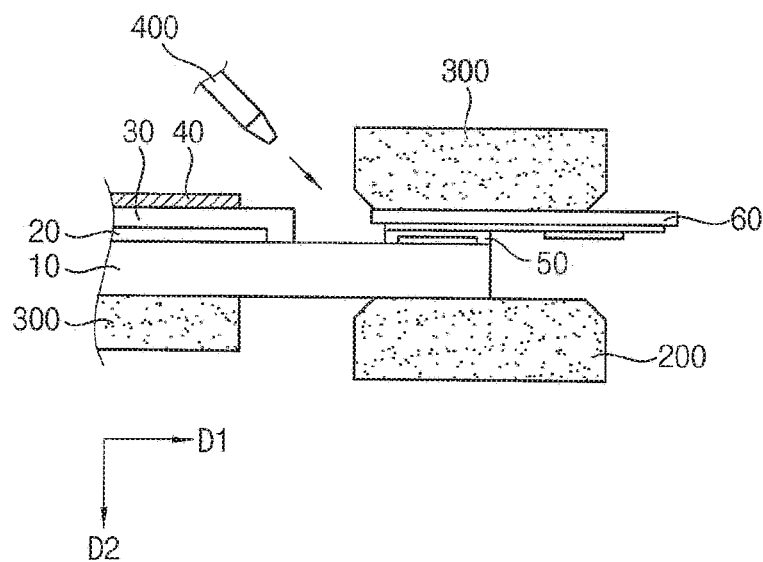

Referring to FIG. 3D, the pressing head 100 and the backup plate 200 may press and heat the anisotropic conductive film 50 between the flexible circuit film 60 and the TFT substrate 10.

On the other hand, the location of the backup plate 200 may be fixed and arranged to be spaced apart from the stage 300. One side of the lower surface of the pressing head 100 and one side of the upper surface of the backup plate 200 may be arranged to coincide in the second direction D2. The pressing head 100 may press the flexible circuit film 60 while being spaced apart from the optical member 40 disposed on the TFT substrate 10. Therefore, the optical member 40 which is vulnerable to thermal shock can be protected from being damaged by heat.

At this time, as described above, by supplying air between the optical member 40 and the pressing head 100, it is possible to block the heat from the pressing head 100 being transmitted to the optical member 40.

In addition, the temperature of the upper surface of the backup plate 200 is controlled to a temperature of less than 170 degrees Celsius. The temperature of the lower surface of the pressing head 100 may be controlled higher than the temperature of the upper surface of the backup plate 200. For example, the temperature of the upper surface of the backup plate 200 may be controlled to be equal to or greater than 150 degrees Celsius and less than 170 degrees Celsius, and the temperature of the lower surface of the pressing head 100 may be controlled to be equal to or greater than 150 degrees Celsius and less than 200 degrees Celsius.

Accordingly, temperature of the anisotropic conductive film 50 may be raised to a melting temperature, and the thermocompression bonding and curing may occur, while reducing the working time, and the optical member 40 including the structure of the display apparatus, for example, a polarizing plate, which is vulnerable to thermal shock, may be protected from being damaged.

Figure 3E:
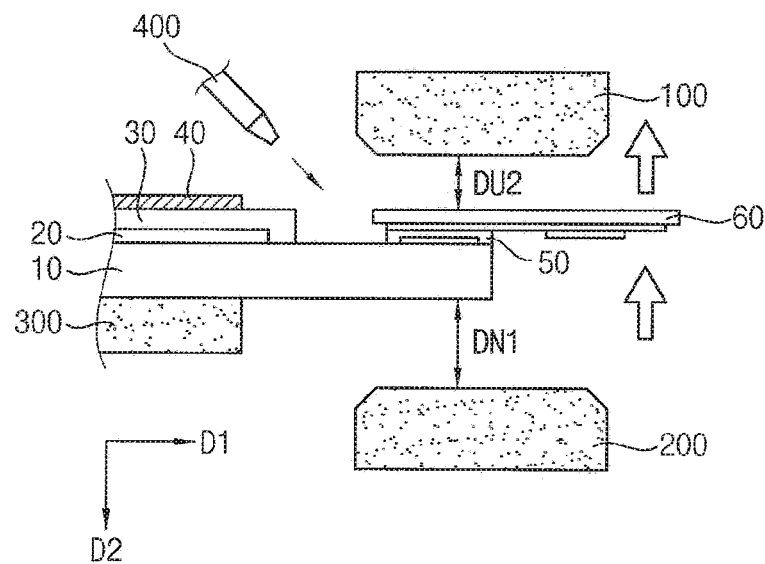

Referring to FIG. 3E, the pressing head 100 may be moved in a direction opposite to the second direction D2 at a fourth speed, and the stage 300 may be moved at a fifth speed slower than the fourth speed in the direction opposite to the second directions D2. For example, the fourth speed may be equal in magnitude to the second speed and opposite in direction, and the fifth speed may be equal in magnitude and opposite in direction to the third speed.

Accordingly, between the lower surface of the pressing head 100 and the flexible circuit film 60 may be spaced apart by the second upper distance DU2, and the TFT substrate 10 and the upper surface of the backup plate 200 may be spaced apart by the first lower distance DN1.

For example, the second upper distance DU2 may be 10 mm, and the first upper distance DN1 may be 8 mm.

Figure 3F:
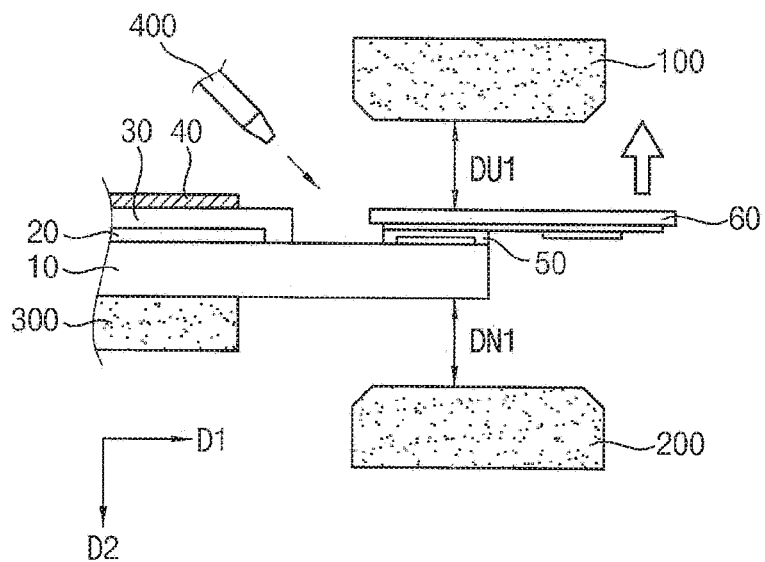

Referring to FIG. 3F, the pressing head 100 may be moved in the direction opposite to the second direction D2 at a sixth speed faster than the fourth speed. The sixth speed may be the same as the first speed and may be opposite in direction. Accordingly, the lower surface of the pressing head 100 and the flexible circuit film 60 may be spaced apart by the first upper distance DU1. For example, the first upper distance DU1 may be 16 mm.

Accordingly, the processing time of the thermocompression bonding process of the anisotropic conductive film 50 may be shortened, and therefore, a damage due to thermal shock to the structure of the display apparatus may be reduced.

FIG. 4 is a flow chart showing a method of bonding a flexible circuit film using a flexible circuit film bonding apparatus according to an exemplary embodiment.

Referring to FIG. 4, the method of bonding the flexible circuit film may include a horizontal moving step (S100), and engaging of the pressing head and the backup plate step which includes a first vertical moving step (S200) and a second vertical moving step (S300), a heating and pressing step (S400) and disengaging of the pressing head and the backup plate step which includes a third vertical moving step (S500) and a fourth vertical moving step (S600).

In the horizontal moving step (S100), a TFT substrate disposed on a stage may be moved in a horizontal direction to position a flexible circuit film between a pressing head and a backup plate with the flexible circuit film attached to the TFT substrate by an anisotropic conductive film.

In the engaging of the pressing head and the backup plate step, the pressing head and the backup plate or the stage may be moved in a vertical direction such that a lower surface of the pressing head contacts the flexible circuit film and an upper surface of the backup plate contacts the TFT substrate.

In the first vertical moving step (S200), the pressing head may move at a first speed.

In the second vertical moving step (S300), the pressing head may move at a second speed slower than the first speed, and simultaneously, the stage may move at a third speed slower than the second speed.

At this time, the lower surface of the pressing head may contact on the flexible circuit film after the upper surface of the backup plate contacts the TFT substrate In the heating and pressing step (S400), the anisotropic conductive film between the flexible circuit film and the TFT substrate may be pressed and heated by using the pressing head and the backup plate, wherein a temperature of the upper surface of the backup plate may be controlled to be heated to less than 170 degrees Celsius.

A temperature of the lower surface of the pressing head may be controlled to be higher than the temperature of the upper surface of the backup plate. The temperature of the upper surface of the backup plate may be controlled to be equal to or greater than 150 degrees Celsius and less than 170 degrees Celsius. The temperature of the lower surface of the pressing head may be controlled to be equal to or greater than 150 degrees Celsius and less than 200 degrees Celsius. The pressing head may press the flexible circuit film while being spaced apart from an optical member disposed on the TFT substrate. Air may be provided between the optical member and the pressing head to block heat from the pressing head from being transmitted to the optical member.

One side of the lower surface of the pressing head and one side of the upper surface of the backup plate may be arranged to coincide in the vertical direction. The location of the backup plate may be fixed spaced apart from the stage.

In the disengaging of the pressing head and the backup plate step, the pressing head and the backup plate or the stage may be moved in the vertical direction such that the head and the backup plate are spaced apart from the flexible circuit film and the TFT substrate.

In the third vertical moving step (S500), the pressing head may move at a fourth speed, and the stage may move at a fifth speed slower than the fourth speed. For example, the fourth speed may be equal in magnitude and opposite in direction to the second speed. The fifth speed may be the same as the third speed and may be opposite in direction.

In the fourth vertical moving step (S600), the pressing head may move at a sixth speed faster than the fourth speed. For example, the sixth speed may be the same as the first speed and opposite in direction.

According to the exemplary embodiments of the present inventive concept, a flexible circuit film bonding apparatus includes a stage configured to support a TFT substrate, a pressing head configured to press and heat a flexible circuit film attached by an anisotropic conductive film on the TFT substrate, a backup plate configured to support and heat the TFT substrate positioned below the flexible circuit film, and a heating control unit configured to control a temperature of a lower surface of the pressing head and an upper surface of the backup plate, wherein the temperature of the upper surface of the backup plate is heated to less than 170 degrees Celsius. A method of bonding a flexible circuit film using the flexible circuit film bonding apparatus includes a horizontal moving step, an engaging of the pressing head and the backup plate step, a heating and pressing step and a disengaging of the pressing head and the backup plate step.

In the process of thermocompression bonding the anisotropic conductive film between the flexible circuit film and the TFT substrate, it is possible to control appropriate temperature, so that defects due to thermal-expansion can be prevented or reduced.

In particular, it is possible to prevent or reduce the occurrence of defects by attaching the flexible circuit film in a proper position, even when the interval between the contacting electrodes is narrower because of higher resolution of the display apparatus, reduction of peripheral area which is a non-display area in which contacting electrodes are disposed, or adoption of NoMux structure due to lack of SOT according to an increase of the aspect ratio.

In addition, temperature of the anisotropic conductive film may be raised to a melting temperature, and the thermocompression bonding and curing may occur, while reducing the working time, and the optical member including the structure of the display apparatus, for example, a polarizing plate, which is vulnerable to thermal shock, may be protected from being damaged.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A flexible circuit film bonding apparatus, comprising:
    a stage configured to support a TFT substrate;
    a pressing head configured to press and heat a flexible circuit film attached on the TFT substrate with an anisotropic conductive film interposed therebetween;
    a backup plate configured to support and heat the TFT substrate positioned below the flexible circuit film;
    a heating control unit configured to control a temperature of a lower surface of the pressing head and an upper surface of the backup plate;
    a head driving unit configured to move the pressing head in a vertical direction; and
    a stage driving unit configured to move the stage along the vertical direction and a horizontal direction perpendicular to the vertical direction,
    wherein the temperature of the upper surface of the backup plate is less than 170 degrees Celsius.

2. The flexible circuit film bonding apparatus of claim 1, wherein the temperature of the lower surface of the pressing head is controlled to be higher than the temperature of the upper surface of the backup plate.

3. The flexible circuit film bonding apparatus of claim 2, wherein the temperature of the upper surface of the backup plate is controlled to be equal to or greater than 150 degrees Celsius and less than 170 degrees Celsius.

4. The flexible circuit film bonding apparatus of claim 3, wherein the temperature of the lower surface of the pressing head is controlled to be equal to or greater than 150 degrees Celsius and less than 200 degrees Celsius.

5. The flexible circuit film bonding apparatus of claim 1, wherein the backup plate is disposed at a fixed location spaced apart from the stage.

6. The flexible circuit film bonding apparatus of claim 5, wherein one side of the lower surface of the pressing head and one side of the upper surface of the backup plate are arranged to align in the vertical direction.

7. The flexible circuit film bonding apparatus of claim 6, wherein the pressing head is configured to press the flexible circuit film while being spaced apart from an optical member disposed on the TFT substrate,
    wherein the flexible circuit film bonding apparatus further comprises an air supply unit configured to supply air between the optical member and the pressing head to block heat generated by the pressing head from being transmitted to the optical member.

8. The flexible circuit film bonding apparatus of claim 5, wherein the head driving unit is configured to move the pressing head at one of a first speed and a second speed, the second speed being slower than the first speed, and
    the stage driving unit is configured to move the stage at a third speed in the vertical direction, the third speed being slower than the second speed.

9. A method of bonding a flexible circuit film, the method comprising:
    horizontally moving a stage, a TFT substrate being disposed on the stage in a horizontal direction to position a flexible circuit film between a pressing head and a backup plate, the flexible circuit film being attached to the TFT substrate with an anisotropic conductive film interposed therebetween;
    engaging the pressing head and the backup plate, comprising:

vertically moving the pressing head and one of the backup plate and the stage in a vertical direction such that a lower surface of the pressing head contacts the flexible circuit film and an upper surface of the backup plate contacts the TFT substrate;

heating and pressing the anisotropic conductive film interposed between the flexible circuit film and the TFT substrate by using the pressing head contacting the flexible circuit film and the backup plate contacting the TFT substrate, wherein a temperature of the upper surface of the backup plate is controlled to be less than 170 degrees Celsius; and disengaging the pressing head and the backup plate, comprising:
vertically moving the pressing head and one of the backup plate and the stage in the vertical direction such that the head and the backup plate are detached from the flexible circuit film and the TFT substrate.

10. The method of claim 9, wherein the heating and pressing of the anisotropic conductive film comprises:
controlling a temperature of the lower surface of the pressing head to be higher than the temperature of the upper surface of the backup plate.

11. The method of claim 10, wherein the heating and pressing of the anisotropic conductive film further comprises:
controlling the temperature of the upper surface of the backup plate to be equal to or greater than 150 degrees Celsius and less than 170 degrees Celsius.

12. The method of claim 11, wherein the heating and pressing of the anisotropic conductive film further comprises;
controlling the temperature of the lower surface of the pressing head is controlled to be equal to or greater than 150 degrees Celsius and less than 200 degrees Celsius.

13. The method of claim 9, wherein the engaging of the pressing head and the backup plate further comprises:
vertically moving the pressing head at a first speed; and
subsequent to vertically moving of the pressing head at the first speed, vertically moving the pressing head at a second speed slower than the first speed, and the stage at a third speed slower than the second speed, simultaneously.

14. The method of claim 13, wherein the first speed is about 5 to 20 times faster than the second speed.

15. The method of claim 13, wherein the disengaging of pressing head and the backup plate further comprises:
vertically moving the pressing head at a fourth speed, and moving the stage vertically at a fifth speed slower than the fourth speed; and
subsequent to vertically moving of the pressing head at the fourth speed, vertically moving the pressing head vertically at a sixth speed faster than the fourth speed.

16. The method of claim 13, wherein the horizontally moving of the stage comprises: disposing the stage such that a distance between the lower surface of the pressing head and the flexible circuit film is equal to or greater than 1.5 times a distance between the upper surface of the backup plate and the TFT substrate, and
wherein vertically moving of the pressing head at the first speed comprises: vertically moving the pressing head at the first speed such that the distance between the lower surface of the pressing head and the flexible circuit film is greater than the distance between the upper surface of the backup plate and the TFT substrate.

17. The method of claim 9, wherein the disengaging the pressing head and the backup plate further comprises: vertically moving the pressing head and one of the backup plate and the stage in the vertical direction such that the lower surface of the pressing head contacts on the flexible circuit film after the upper surface of the backup plate contacts the TFT substrate.

18. The method of claim 9, wherein the engaging of the pressing head and the backup plate further comprises: vertically moving the pressing head and one of the backup plate and the stage in a vertical direction such that the pressing head presses the flexible circuit film while being spaced apart from an optical member disposed on the TFT substrate, and
wherein the heating and pressing of the anisotropic conductive film comprises: providing air between the optical member and the pressing head to block heat generated by the pressing head from being transmitted to the optical member.

19. The method of claim 18, wherein one side of the lower surface of the pressing head and one side of the upper surface of the backup plate are arranged to align in the vertical direction, and
wherein the backup plate is disposed at a fixed location spaced apart from the stage.

* * * * *